US010037881B2

(12) United States Patent
Pagliaro et al.

(10) Patent No.: US 10,037,881 B2
(45) Date of Patent: Jul. 31, 2018

(54) WAFER CLEANING APPARATUS AND WAFER CLEANING METHOD USING THE SAME

(71) Applicant: APET, Hwaseong-Si, Gyeonggi-Do (KR)

(72) Inventors: Robert Henry Pagliaro, Mesa, AZ (US); Sung Ho Hong, Yongin-si (KR); Jin Tae Kim, Yongin-si (KR); Deok Ho Kim, Yongin-si (KR)

(73) Assignee: APET, Hwaseong-si (KR)

( * ) Notice: Subject to any disclaimer, the term of this patent is extended or adjusted under 35 U.S.C. 154(b) by 27 days.

(21) Appl. No.: 14/997,378

(22) Filed: Jan. 15, 2016

(65) Prior Publication Data

US 2016/0133455 A1 May 12, 2016

Related U.S. Application Data

(62) Division of application No. 13/383,201, filed as application No. PCT/KR2009/007192 on Dec. 3, 2009, now Pat. No. 9,240,335.

(30) Foreign Application Priority Data

Jul. 10, 2009 (KR) .................... 10-2009-0063083

(51) Int. Cl.
*B08B 3/08* (2006.01)
*H01L 21/02* (2006.01)
*H01L 21/67* (2006.01)

(52) U.S. Cl.
CPC .......... *H01L 21/02052* (2013.01); *B08B 3/08* (2013.01); *H01L 21/67017* (2013.01)

(58) Field of Classification Search
CPC ................. B08B 3/08; H01L 21/02052; H01L 21/67017

(Continued)

(56) References Cited

U.S. PATENT DOCUMENTS 4,749,440 A * 6/1988 Blackwood ....... H01L 21/31116
134/1.3
6,221,168 B1 * 4/2001 Carter ............... H01L 21/31116
134/1

(Continued)

FOREIGN PATENT DOCUMENTS

EP 1571 701 A1 9/2005
JP 5-335295 12/1993

(Continued)

OTHER PUBLICATIONS

International Search Report, corresponding to PCT/KR2009/007192, dated Jul. 16, 2010, 4 pages.

(Continued)

*Primary Examiner* — Levon J Shahinian
(74) *Attorney, Agent, or Firm* — Lewis Roca Rothgerber Christie LLP

(57) ABSTRACT

The object of the present invention is to provide a wafer cleaning apparatus that reduces the amount of dissolved oxygen, without using hydrogen peroxide, to be able to reduce the deformation, etc. of a wafer and to reduce silicon consumption and a wafer cleaning method using the same. The present invention provides a wafer cleaning apparatus comprising: a first thin film contactor that receives drug solution for removing an oxide film or ultra pure water to separate and discharge gas dissolved in the drug solution for removing the oxide film or the ultra pure water; a second thin film contactor that receives the drug solution for removing the oxide film or the ultra pure water discharged from the first thin film contactor; a vacuum pump that discharges gas separated in the first and second thin film contactors to the outside; and a process vessel that stores the drug solution for removing the oxide film or the ultra pure water discharged from the second thin film contactor, and a wafer cleaning method using the same.

12 Claims, 2 Drawing Sheets

(58) Field of Classification Search
USPC ................ 134/1.3, 26, 30, 105, 109, 115 R
See application file for complete search history.

(56) References Cited

U.S. PATENT DOCUMENTS

| | | |
|---|---|---|
| 2004/0139987 A1 | 7/2004 | Mount |
| 2004/0159335 A1* | 8/2004 | Montierth ................ B08B 3/08 |
| | | 134/10 |
| 2004/0191079 A1 | 9/2004 | Ohmi et al. |
| 2009/0165829 A1 | 7/2009 | Morita et al. |

FOREIGN PATENT DOCUMENTS

| | | |
|---|---|---|
| JP | 11-16873 | 1/1999 |
| JP | 2006-269668 A | 10/2006 |
| JP | 2008-080255 A | 4/2008 |
| KR | 10-0213243 | 5/1998 |
| KR | 10-2009-0007701 | 1/2009 |

OTHER PUBLICATIONS

Korean Intellectual Property Office (KIPO); Office action dated Mar. 8, 2011 for Application No. KR 10-2009-0063083; 3 Pages.
Korean Intellectual Property Office (KIPO); Notice of Allowance dated Nov. 30, 2011 for Application No. KR 10-2009-0063083; 1 Page.

* cited by examiner

[Fig. 1]
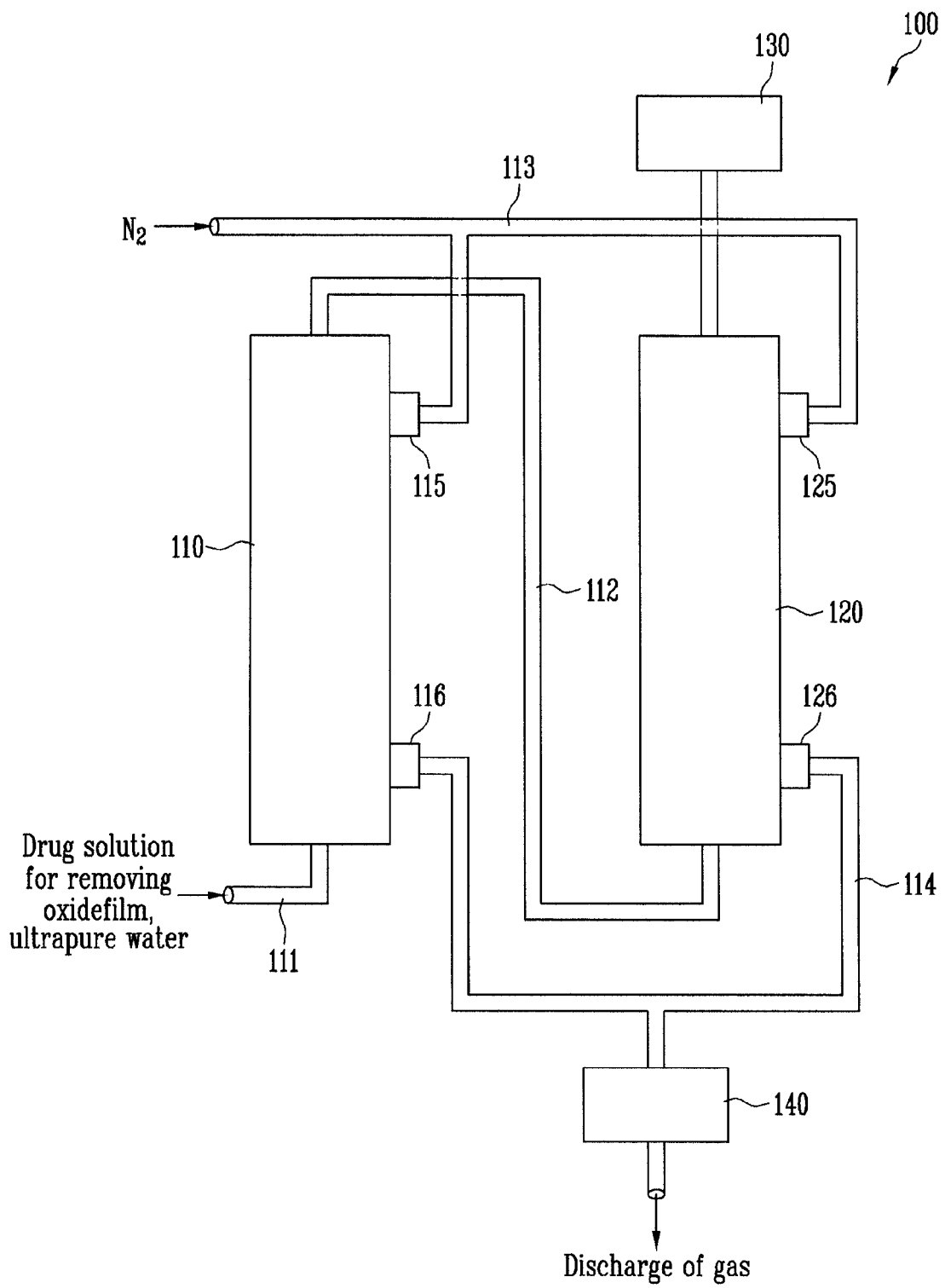

[Fig. 2]
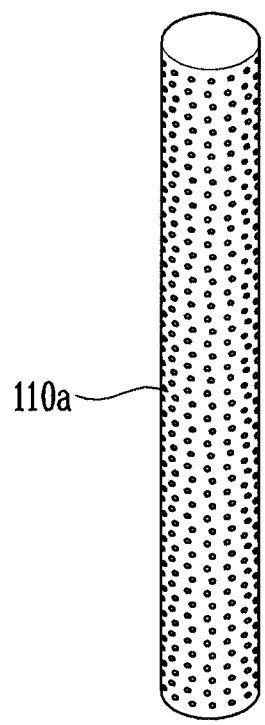

WAFER CLEANING APPARATUS AND WAFER CLEANING METHOD USING THE SAME

CROSS-REFERENCE TO RELATED APPLICATION

This application is a divisional of U.S. National Phase Patent Application No. 13/383,201, filed Mar. 8, 2012, which claims priority to and the benefit of International Patent Application No. PCT/KR2009/007192, filed Dec. 3, 2009, which claims priority of Korean Patent Application No. 10-2009-0063083 filed on Jul. 10, 2009, the entire content of all of which is incorporated herein by reference.

TECHNICAL FIELD

The present invention relates to a wafer cleaning apparatus and a wafer cleaning method using the same, and more particularly, to a wafer cleaning apparatus that can reduce the damage and deformation of a wafer when cleaning the wafer and a wafer cleaning method using the same.

BACKGROUND ART

Currently, semiconductor manufacturing technology has been highly integrated to be 10 nm or less and has been continuously developing. Owing to the high-integration, the line width becomes narrow in the production of silicon wafers used in producing a semiconductor, and change in patterns, temperature, silicon consumption, etc. become very important factors.

Generally, a cleaning method using hydrogen peroxide ($H_2O_2$) or a cleaning method using ozone ($O_3$) is used in a wafer. The cleaning method using hydrogen peroxide ($H_2O_2$) is a method to remove particles by mixing hydrogen peroxide, ammonia, and pure water, and the cleaning method using ozone ($O_3$) is a method to remove organic material by mixing ozone with sulfuric acid.

However, if the cleaning method using hydrogen peroxide and the cleaning method using ozone are used, oxygen in the cleaning liquid is reacted to the wafer silicon to generate chemical oxide. Therefore, in order to remove the chemical oxide, it has been adopted a method to etch the surface of the wafer using hydrogen fluoride at the last step of cleaning.

However, although the method to etch the surface of the wafer using hydrogen fluoride at the last step is used, the oxide is also defected from the surface of the wafer. In particular, the method to use the hydrogen fluoride at the last step causes a problem in a fine process of 90 nm or less.

In particular, after cleaning, the silicon consumption of 1 Å or less has been recently required. It means that the cleaning method using hydrogen peroxide and the cleaning method using ozone are not suitable for cleaning the wafer.

DETAILED DESCRIPTION OF THE INVENTION

Technical Problem

The present invention is proposed to solve the problems. The object of the present invention is to provide a wafer cleaning apparatus that reduces the amount of dissolved oxygen, without using hydrogen peroxide, to be able to reduce the deformation, etc. of a wafer and to reduce silicon consumption and a wafer cleaning method using the same.

Technical Solving Mode

To achieve the above object, according to one embodiment of the present invention, there is provided a wafer cleaning apparatus including: a first thin film contactor that receives drug solution for removing an oxide film or ultra pure water to separate and discharge gas dissolved in the drug solution for removing the oxide film or the ultra pure water; a second thin film contactor that receives the drug solution for removing the oxide film or the ultra pure water discharged from the first thin film contactor; a vacuum pump that discharges gas separated in the first and second thin film contactors to the outside; and a process vessel that stores the drug solution for removing the oxide film or the ultra pure water discharged from the second thin film contactor.

Moreover, the drug solution for removing the oxide film includes hydrogen fluoride or buffered oxide etchant (BOE).

Further, the hydrogen fluoride has a concentration of 0.01 to 49 wt %.

In addition, the concentration of the dissolved oxygen is 500 ppt or less in the drug solution for removing the oxide film or the ultra pure water.

According to one embodiment of the present invention, there is provided a wafer cleaning method in which the oxide film of the surface of a silicon wafer is removed and is hydrogen-terminated so that a natural oxide film is not grown on the surface of the wafer, the wafer cleaning method including: after supplying drug solution for removing the oxide film to a thin film contactor, driving a vacuum pump and then injecting nitrogen into the thin film contactor; removing the dissolved gas of the drug solution for removing the oxide film by discharging the gas by the vacuum pump; and cleaning the surface of the wafer using the drug solution for removing the oxide film to be hydrogen-terminated.

Moreover, the drug solution for removing the oxide film includes hydrogen fluoride or BOE.

Further, the hydrogen fluoride has a concentration of 0.01 to 49 wt %.

In addition, the concentration of the dissolved oxygen is 500ppt or less in the drug solution for removing the oxide film or the ultra pure water.

Advantageous Effect

With the wafer cleaning apparatus and the wafer cleaning method using the same according to the present invention, the amount of dissolved oxygen in the drug resolution for removing the oxide film can be reduced, making it possible to reduce the oxide generated from the surface of the wafer when cleaning the silicon wafer. Therefore, the fine process work can be easily performed.

BRIEF DESCRIPTION OF THE DRAWING

The above and other objects, features and advantages of the present invention will become apparent from the following description of preferred embodiments given in conjunction with the accompanying drawings, in which:

FIG. 1 is a diagram showing the structure of a wafer cleaning apparatus according to the present invention; and FIG. 2 is a diagram showing the structure of a porous polymer membrane contactor in a thin film contactor.

BEST MODES FOR CARRYING OUT THE INVENTION

Hereinafter, exemplary embodiments of the present invention will be described in detail with reference to the accompanying drawings.

FIG. 1 is a diagram showing the structure of a wafer cleaning apparatus according to the present invention, and FIG. 2 is a diagram showing the structure of a porous polymer membrane contactor in a thin film contactor. Referring to FIGS. 1 and 2, the wafer cleaning apparatus 100 includes a first thin film contactor 110, a second thin film contactor 120, a process vessel 130, and a vacuum pump 140.

The first thin film contactor 110 and the second thin film contactor 120 have a porous polymer membrane contactor 110a therein to remove gas. A plurality of small holes are formed on the surface of the porous polymer membrane contactor 110a and a filter whose inside is hollow is provided. Also, the first thin film contactor 110 and the second thin film contactor 120 include first and second gas inlets 115 and 125 and first and second gas outlets 116 and 126, respectively.

The first thin film contactor 110 receives drug solution for removing an oxide film or ultra pure water from a first pipe 111. And, the first thin film contactor 110 is coupled to the second thin film contactor 120 by a second pipe 112. Also, the first thin film contactor 110 and the second thin film contactor 120 receives nitrogen through a third pipe 113 that is coupled to first and second gas inlets 115 and 125. And, the first thin film contactor 110 and the second thin film contactor 120 allows the vacuum pump 140 coupled to a fourth pipe 114 that is coupled to the first and second gas outlets 116 and 126 to discharge the gas dissolved in the drug solution for removing the oxide film or the ultra pure water through the fourth pipe 114. The drug solution for removing the oxide film includes hydrogen fluoride (HF) and/or buffered oxide etchant (BOE), and the gas dissolved in the drug solution for removing the oxide film includes oxygen ($O_2$), carbon dioxide ($CO_2$), carbon monoxide (CO), total organic carbon (TOC), etc.

Gas is dissolved in the drug solution for removing the oxide film or the ultra pure water that is supplied to the first thin film contactor 110 through the first pipe 111.

Moreover, if the drug solution for removing the oxide film is supplied to the first thin film contactor 110 and the second thin film contactor 120 to drive the vacuum pump 140 and then nitrogen is supplied thereto, nitrogen is discharged to the first and second gas outlets 116 and 126 by the vacuum pump 140 at the moment when nitrogen is supplied through the first and second gas inlets 115 and 125. At this moment, the gases dissolved in the drug solution for removing the oxide film are reacted to nitrogen to be easily flowed into the vacuum pump 140 so that the removal efficiency of the gas dissolved in the drug solution for removing the oxide film or the ultra pure water is enhanced. The vacuum pump 140 discharges the gas at the pressure of 27 inch Hg at maximum.

The drug solution for removing the oxide film whose gas is removed by the first and second thin film contactors 120 is supplied to the process vessel 130.

The process vessel 130 stores the drug solution for removing the oxide film whose gas is separated by the first thin film contactor 110 and the second thin film contactor 120 to allow it to be used in the cleaning process. Also, the drug solution for removing the oxide film can be diluted using the ultra pure water whose gas is separated by the first thin film contactor 110 and the second thin film contactor 120. The concentration of the dissolved oxygen in the drug solution for removing the oxide film stored in the process vessel 130 becomes 500 ppt or less.

The reason why the concentration of the dissolved oxygen becomes 500 ppt or less is that there is a close interrelation between the dissolved oxygen in the hydrogen fluoride and residual oxide. The reason will be described below.

i) Water has an influence on low-concentration fluorine positioned on Si—OH group etched by hydrogen fluoride.

ii) The portion affected by the low-concentration fluorine generates a thermal exciton where an electron and a hole are coupled.

iii) A crack of Si-Si back bond is generated due to the exciton so that it is divided into Si– on the surface and Si+ under the surface.

iv) Si+ under the surface is coupled with water molecules and Si– on the surface is changed into SiOO— form by the dissolved oxygen so that a proton is transitioned into SiOO— from additive of water in Si—OH and Si—OOH.

From the above results, it can be appreciated that oxygen causes improved oxidation through the inter-coupling effects between water ($H_2O$) and OH—, and between water ($H_2O$) and $O_2$.

In other words, the amount of the oxide film generated on the surface of the wafer according to oxygen dissolved in solution, that is, the amount of dissolved oxygen. Therefore, the amount of dissolved oxygen of the drug solution for removing the oxide film or the ultra pure water, etc. becomes a very important factor, and it is very important to remove the dissolved oxygen from the drug solution for removing the oxide film or the ultra pure water, etc.

In the present invention, the mixture ratio between the ultra pure water whose amount of dissolved oxygen is 500 ppt and hydrogen fluoride becomes 100:1 or more.

Moreover, if the surface of the wafer is cleaned by the drug solution for removing the oxide film diluted by the drug solution for removing the oxide film or the ultra pure water contained in the process vessel according to the present invention, the surface of the silicon wafer is hydrogen-terminated and the oxide film formed on the surface of the silicon wafer has a thickness of 1 Å or less.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A wafer cleaning method in which an oxide film of a surface of a silicon wafer is removed and is hydrogen-terminated so that a natural oxide film is not grown on the surface of the silicon wafer, the wafer cleaning method comprising:
   supplying a drug solution in a liquid state and comprising dissolved gas for removing the oxide film to a thin film contactor;
   driving a vacuum pump and injecting nitrogen into the thin film contactor, after supplying the drug solution to the thin film contactor;
   reacting the dissolved gas of the drug solution with the injected nitrogen, after injecting the nitrogen into the thin film contactor;
   discharging the dissolved gas of the drug solution by the vacuum pump to remove the dissolved gas, after reacting the dissolved gas of the drug solution with the injected nitrogen; and
   cleaning the surface of the silicon wafer to be hydrogen-terminated by using the drug solution.

2. The wafer cleaning method as claimed in claim 1, wherein the drug solution for removing the oxide film includes hydrogen fluoride or buffered oxide etchant (BOE).

3. The wafer cleaning method as claimed in claim 2, wherein the hydrogen fluoride has a concentration of 0.01 to 49wt %.

4. The wafer cleaning method as claimed in claim 1, wherein a concentration of a dissolved oxygen is 500 ppt or less in the drug solution for removing the oxide film.

5. The wafer cleaning method as claimed in claim 1 further comprising:
supplying the drug solution for removing the oxide film in series to at least two thin film contactors.

6. The wafer cleaning method as claimed in claim 5, wherein the nitrogen is supplied in parallel to the at least two thin film contactors.

7. The wafer cleaning method as claimed in claim 1, wherein the nitrogen is injected into the thin film contactor at a position adjacent to a downstream side of the drug solution for removing the oxide film flowing in the thin film contactor.

8. The wafer cleaning method as claimed in claim 1, wherein the nitrogen is discharged from the thin film contactor at a position adjacent to an upstream side of the drug solution for removing the oxide film flowing in the thin film contactor.

9. The wafer cleaning method as claimed in claim 1, further comprising diluting the drug solution for removing the oxide film with ultra pure water from which gas is separated by the thin film contactor.

10. The wafer cleaning method as claimed in claim 1, wherein the thin film contactor comprises a porous polymer membrane contactor.

11. The wafer cleaning method as claimed in claim 10, wherein the polymer membrane contactor has a surface with a plurality of small holes.

12. The wafer cleaning method as claimed in claim 11, wherein the polymer membrane contactor has filter whose inside is hollow.

* * * * *